United States Patent [19]
Kadota et al.

[11] Patent Number: 5,914,554
[45] Date of Patent: Jun. 22, 1999

[54] SURFACE WAVE RESONATOR

[75] Inventors: Michio Kadota, Kyoto; Junya Ago, Nagaokakyo, both of Japan

[73] Assignee: Murata Manufacturing Co., Ltd., Japan

[21] Appl. No.: 08/706,303

[22] Filed: Aug. 30, 1996

[30] Foreign Application Priority Data

Aug. 31, 1995 [JP] Japan ................................. 7-223229

[51] Int. Cl.⁶ .................................................. H01L 41/08
[52] U.S. Cl. ...................................... 310/313 B; 333/193
[58] Field of Search ........................... 310/313 B, 313 C, 310/313 R; 333/193–195, 150, 151, 154

[56] References Cited

U.S. PATENT DOCUMENTS

| | | | |
|---|---|---|---|
| 3,252,017 | 5/1966 | Bartels | 310/313 B |
| 3,523,200 | 8/1970 | Newell | 310/313 B |
| 4,016,440 | 4/1977 | Wagers | 310/313 B |
| 5,260,913 | 11/1993 | Kadota et al. | 310/313 B X |
| 5,550,793 | 8/1996 | Dufilie | 310/313 B |
| 5,684,437 | 11/1997 | Ago et al. | 333/195 |
| 5,705,964 | 1/1998 | Tera et al. | 333/193 |
| 5,714,830 | 2/1998 | Kadota et al. | 310/313 B X |
| 5,793,147 | 8/1998 | Kadota et al. | 310/313 R |

FOREIGN PATENT DOCUMENTS

| | | |
|---|---|---|
| 2009546 | 6/1979 | United Kingdom. |
| 2287580 | 9/1995 | United Kingdom. |

OTHER PUBLICATIONS

M. Kadota, "BGS Wave Resonators Adopt Ceramic Substrate, Realize Low Cost", *JEE Journal of Electronic Engineering*, vol. 32, No. 337, pp. 33–36, Jan. 1, 1995.

*Patent Abstracts of Japan*, vol. 017, No. 599 (E–1455), Nov. 2, 1993 & JP–A–05 183376, Jul. 23, 1993.

*Primary Examiner*—Mark O. Budd
*Attorney, Agent, or Firm*—Ostrolenk, Faber, Gerb & Soffen, LLP

[57] ABSTRACT

An end-face reflecting-type surface wave resonator using the SH-type surface wave achieves two types of resonance characteristics by use of only a single device. An interdigital transducer having a pair of comb-like electrodes are formed on a piezoelectric substrate having two oppositely-facing end faces. The interdigital transducer has two peaks of main lobes and are assigned with weights so that the two peaks of main lobes substantially coincide with frequency positions of attenuation poles disposed across a main lobe of a virtual normal-type interdigital transducer having the same number of pairs of electrodes as the weighted interdigital transducer. Thus, two types of resonance characteristics can be obtained.

4 Claims, 5 Drawing Sheets

SURFACE WAVE RESONATOR

BACKGROUND OF THE INVENTION

The present invention relates generally to an end-face reflecting-type surface wave resonator using an SH-type surface wave, such as the BGS wave, the Love wave, or the like. More particularly, the invention relates to an end-face reflecting-type surface wave resonator in which a plurality of resonance units are formed into a single device.

At the video intermediate frequency stage of a television receiver or a video cassette recorder, in order to prevent interference with adjacent channels, it is necessary to sufficiently attenuate signals at the adjacent-channel video signal frequency fap (31.9 MHz according to the European PAL system) and the adjacent-channel sound signal frequency fas (40.4 MHz according to the European PAL system). FIG. 1 is a characteristic diagram of a typical filter indicating attenuation versus frequency at the video intermediate frequency stage. FIG. 1 reveals that a great level of attenuation is conventionally provided at the adjacent-channel video signal frequency fap and the adjacent-channel sound signal frequency fas.

In order to guarantee a great level of attenuation at both the adjacent-channel video signal frequency fap and the adjacent-channel sound signal frequency fas, two trap devices are conventionally employed, such as a trap device having a great level of attenuation at the frequency fap and another trap device having a great level of attenuation at the frequency fas. Each trap device is formed of an LC resonance circuit, a piezo-resonator, or the like.

As a piezo-resonator for the above-described use, attention is being focussed on a piezo-resonator utilizing an SH-type surface wave, such as the BGS wave. FIG. 2 illustrates an example of an end-face reflecting-type surface wave resonator using the BGS wave.

The end-face reflecting-type surface wave resonator generally designated by 1 has a piezoelectric substrate 2 formed in a quadrilateral planar shape. The piezoelectric substrate 2 is formed of a piezoelectric material, such as lead zircotitanate piezoelectric ceramics, $LiNbO_3$ piezoelectric single crystal, $LiTaO_3$ piezoelectric single crystal, etc; the substrate 2 formed of piezoelectric ceramics having been polarized in the direction indicated by the arrow P shown in FIG. 2. Disposed on the top surface 2a of the substrate 2 are a pair of comb-like electrodes 3 and 4 which form an interdigital transducer (hereinafter simply referred to as "the IDT"). The comb-like electrodes 3 and 4 have a plurality of electrode fingers 3a through 3c and 4a through 4c, respectively.

In the surface wave resonator 1 constructed as described above, an AC voltage is applied to the resonator 1 from the comb-like electrodes 3 and 4 to excite the BGS wave which then propagates in the direction indicated by the arrow X and is further reflected between the end faces 2b and 2c. In this resonator 1, the frequency determined by the IDT is matched to the frequency determined by the distance between the end faces, thereby obtaining effective resonance characteristics.

However, the end-face reflecting-type surface wave resonator described above, as well as conventional LC resonance circuits and other types of piezo-resonators, have only a single resonance. Accordingly, two surface wave resonators are required and must be connected to each other in order to achieve trap characteristics at both the adjacent-channel video signal frequency fap and the adjacent-channel sound signal frequency fas.

On the other hand, a single surface-acoustic wave resonator using the Rayleigh wave exhibiting two types of resonance characteristics is disclosed (for example, in Kokusai Electric Co., Ltd., Technical Report No. 16, pages 1–7, 1992). More specifically, in a surface wave resonator filter using the Rayleigh wave, a double mode resonator using a 0th-order longitudinal mode (dominant mode) and a second-order longitudinal mode is known, exhibiting two types of resonance characteristics.

However, in this type of resonator, at least two sets of IDTs and reflectors are required to obtain the two types of resonance characteristics. Also, the resonance characteristics of the double mode resonator are determined by the reflection coefficient versus the frequency characteristics of the reflectors. However, because the resonator has a narrow frequency range having a large reflection coefficient, there is only a very small difference, such as approximately 1 MHz, between two resonance points in a region in which good resonance characteristics are obtained. This makes it difficult to provide the two required trap resonators merely by use of such a double mode resonator, since the two trap resonators have very different frequencies at which the attenuation characteristics shown in FIG. 1 are exhibited.

One of the measures that have been considered to overcome the above-described drawback and to obtain two types of resonance characteristics may be to form two IDTs on a piezoelectric substrate so as to constitute two resonance units, in an end-face reflecting-type surface wave resonator discussed above. However, in the above type of resonator using an SH-type surface wave, such as the BGS wave, the relationship between the wavelength λ of the IDT and the distance L between the oppositely-facing two end faces of the piezoelectric substrate between which the surface wave is reflected can be expressed by $L=(\lambda/2) \times n$ (wherein n is an integer), as schematically illustrated in FIG. 3. A great difference between the adjacent-channel video signal frequency fap and the adjacent-channel sound signal frequency fas causes a significant difference between the respective wavelengths λ. For example, when it is assumed that the speed of sound in the PZT substrate is 2400 m/s, according to the PAL system, the wavelength λap for the adjacent-channel video signal frequency fap is 75.2 μm, while the wavelength λas for the adjacent-channel sound signal frequency fas is 59.4 μm. Accordingly, the distance L between the above-described oppositely-facing end faces of one resonance unit having a resonance point at the adjacent-channel video signal frequency fap differs from that of the other resonance unit having a resonance point at the adjacent-channel sound signal frequency fas. Thus, it is very difficult to form two resonance units having different resonant frequencies on the same substrate of an end-face reflecting-type surface wave resonator using the SH-type surface wave.

SUMMARY OF THE INVENTION

Accordingly, it is an object of the present invention to provide an end-face reflecting-type surface wave resonator using the SH-type surface wave wherein two resonance units having different resonant frequencies are formed as a single device.

In order to achieve the above object, there is provided an end-face reflecting-type surface wave resonator comprising: a piezoelectric substrate having two oppositely-facing end faces for reflecting an SH-type surface wave; and an interdigital transducer disposed on the piezoelectric substrate and assigned with weights according to a cross-width weighting method or an electrode-finger withdrawal method. The frequency characteristics of the weighted interdigital transducer have two main lobes, wherein the weights are assigned to the interdigital transducer in such a manner that the peaks of the two main lobes substantially coincide with frequency positions of attenuation poles, respectively, disposed across a main lobe of frequency characteristics of a virtual normal-type interdigital transducer having the same number of pairs of electrode fingers as that of the weighted interdigital transducer or having a number of pairs of electrode fingers determined by the same distance between the two oppositely-facing end faces as that of the weighted interdigital transducer. The assigned weights obtain first and second types of resonance characteristics in the positions of the attenuation poles of the virtual normal-type interdigital transducer.

More specifically, in the surface wave resonator of the present invention, weights are assigned to an IDT, so that two types of resonance characteristics can be implemented by use of only a single device, utilizing two suppressed attenuation poles disposed across a main lobe of a conventional normal IDT. In this specification, using the maximum point of the excitation strength of the surface wave resonator as a reference, the frequency range in which the attenuation magnitude of the excitation strength relative to the reference is 10 dB or smaller is referred to as "the main lobe", while the frequency range in which the attenuation magnitude of the excitation strength is greater than 10 dB is referred to as "the sub-lobe".

The above-described SH-type surface waves broadly include not only the BGS waves, but also surface waves whose displacements are perpendicular to the propagation direction of the surface wave, such as the Love wave.

The surface wave resonator described herein may preferably be for use in a trap circuit at the video intermediate frequency stage of a television receiver or a video cassette recorder. More specifically, the positions of the above-described respective attenuation poles may be determined in such a manner that the first type of the two resonance characteristics corresponds to the adjacent-channel video signal frequency (fap), and the second type of resonance characteristics has a frequency higher than the frequency of the first type of resonance characteristics and is associated with the adjacent-channel sound signal frequency (fas). It is thus possible to construct a trap circuit at both the adjacent-channel video signal frequency and the adjacent-channel sound signal frequency by use of only a single device.

DETAILED DESCRIPTION OF AN EMBODIMENT OF THE INVENTION

A description will now be given of an embodiment of an end-face reflecting-type surface wave resonator using the BGS wave. As discussed above, the surface wave resonator of the present invention is constructed so as to obtain frequency characteristics in which the two peaks of the main lobes are located at the frequencies corresponding to the attenuation poles of the normal IDT. The best known mode of carrying out the invention will now be explained by way of a surface wave resonator used as a device that forms a trap circuit disposed at the video intermediate frequency stage of a television receiver or the like. Two types of resonance characteristics exhibited by the surface wave resonator are set to correspond to the adjacent-channel video signal frequency fap and the adjacent-channel sound signal frequency fas, respectively.

The aforesaid surface wave resonator can be acquired by the following procedure. After the number N of pairs of electrode fingers of the IDT has been determined, weights are assigned to the IDT having N pairs of electrode fingers so that the peaks of the main lobes can be positioned at the frequencies corresponding to the frequencies fap and fas. This procedure will now be explained in detail.

(1) Determination of the Number N of Pairs of Electrode Fingers of the IDT

Figure 4:
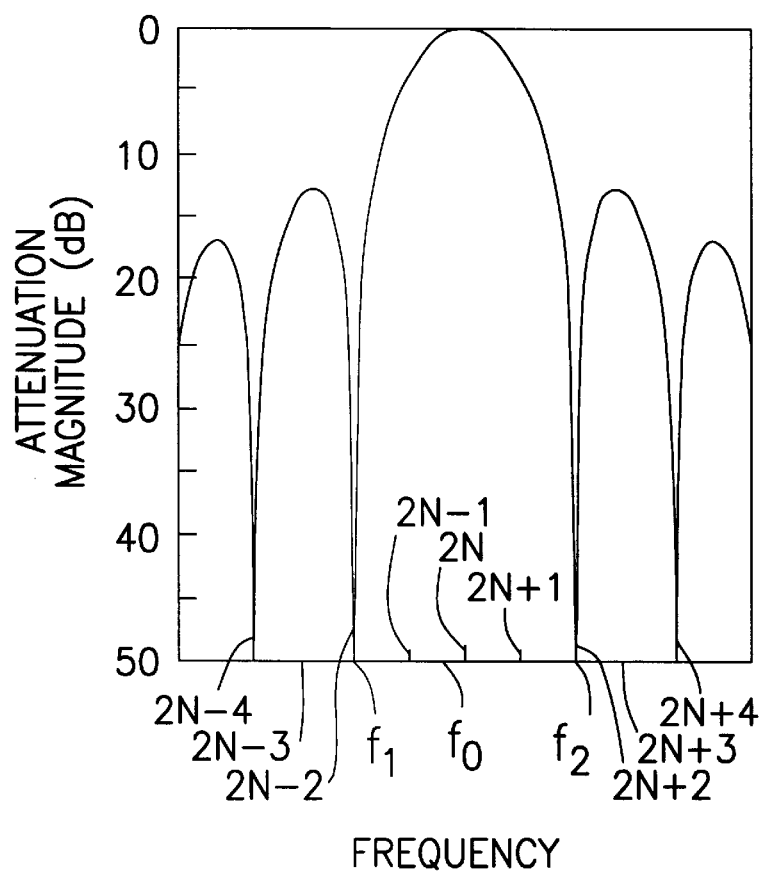
FIG. 4 illustrates a frequency spectrum of a normal IDT.

A description will first be given of the resonant frequency characteristics of the normal IDT for use in the end-face reflecting-type surface wave resonator employing the BGS wave. FIG. 4 illustrates a resonant frequency spectrum of the normal IDT. This type of spectrum is known and is described in, for example, Proceedings of the Spring Meeting of ASG, pp. 351–352, issued in May 1976. Referring to FIG. 4, the horizontal axis indicates the frequency, 2N, 2N−1, etc., designating the positions of the resonance points in the 2N-order mode and the 2N−1-order mode, respectively. On the other hand, the vertical axis represents the attenuation magnitude relative to the peak of the main lobe, which is 0 dB.

Figure 1:
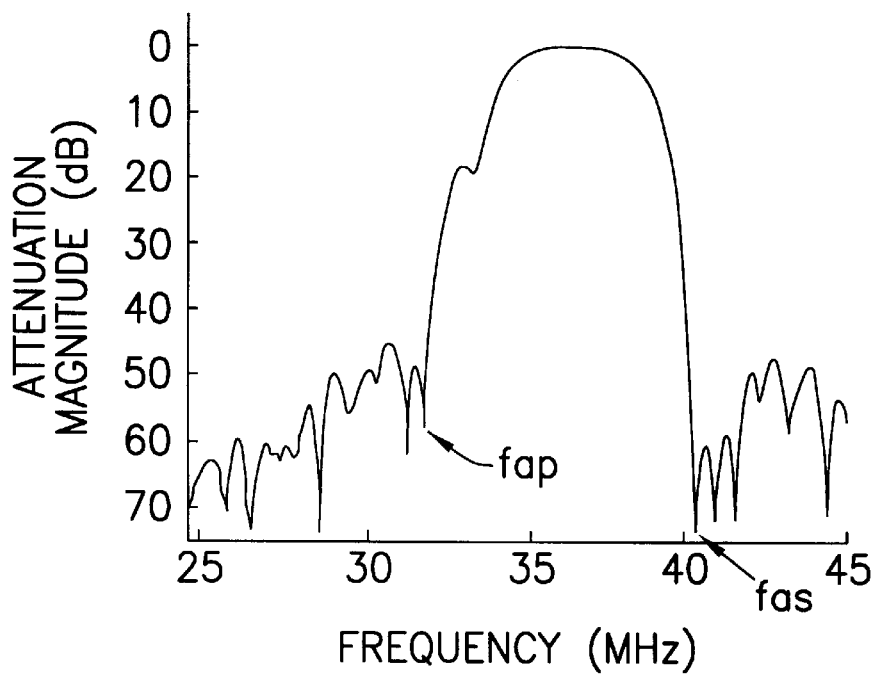
FIG. 1 is a characteristic diagram indicating the attenuation versus frequency characteristics of the video intermediate frequency stage in a conventional television receiver.
Figure 2:
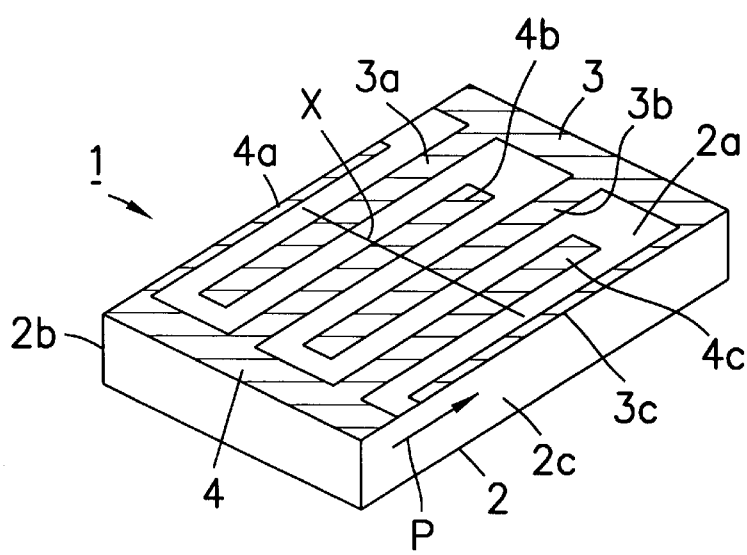
FIG. 2 is a perspective view of a conventional end-face reflecting-type surface wave resonator using the BGS wave.
Figure 3:
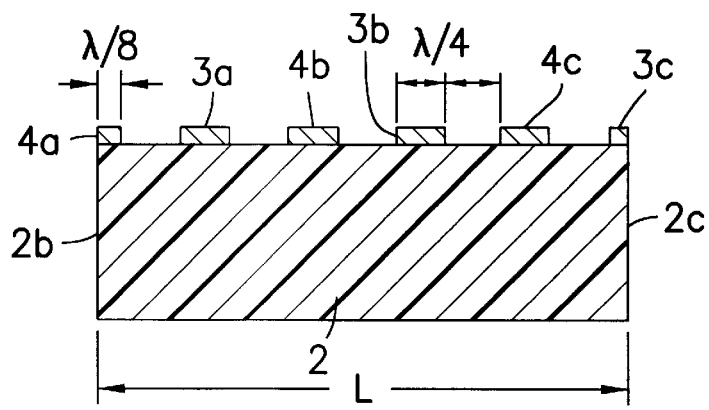
FIG. 3 is a sectional view of a conventional end-face reflecting-type surface wave resonator.

FIG. 4 clearly shows that the 2N-order resonance mode (wherein N is an integer) can be excited by forming the normal IDT provided with the N pairs of electrode fingers on the surface of the piezoelectric substrate. Among the other high-order modes, odd-number modes, such as 2N−1, 2N−3, 2N+1 and 2N+3-order modes, cannot be excited due to the symmetrical properties of the electrodes. On the other hand, even-number modes, such as 2N−2, 2N−4, 2N+2 and 2N+4-order modes, are not excited because, as shown in FIG. 4, the resonant frequencies of such even-number modes respectively coincide with the attenuation poles of the frequency characteristics of the IDT having the N pairs of electrode fingers. Thus, in the above type of surface wave resonator provided with the normal IDT, such as illustrated in FIG. 2, only the 2N-order mode is excited, thereby achieving a resonator with less spurious response. It should be noted, however, that only a single-type of resonance characteristic can be obtained by use of the surface resonator shown in FIG. 2.

In order to overcome the above-described drawback, according to the present invention, the number N of pairs of electrode fingers are determined so that the attenuation poles 2N−2 and 2N+2 of the main lobe of the conventional normal IDT illustrated in FIG. 4 can coincide with the adjacent-channel video signal frequency fap and the adjacent-channel sound signal frequency fas, respectively. More specifically, when the frequency position $f_0$ in the 2N-order mode of the peak of the main lobe is set at the intermediate frequency between the adjacent-channel video signal frequency fap and the adjacent-channel sound signal frequency fas, the number N of pairs of electrode fingers can be found from the formula expressed by $2 \cdot f_0/N \approx fas-fap$. For example, according to the video intermediate frequency (VIF) circuit at the frequency fap of 31.9 MHz and at the frequency fas of 40.4 MHz employed in Europe, the frequency $f_2$ of one attenuation pole 2N+2 of the main lobe of the normal IDT matches the frequency fas, while the frequency $f_1$ of the other attenuation pole 2N−2 coincides with the frequency fap, causing the center frequency f0 of the peak of the main lobe to be $f_0=(31.9+40.4)/2=36.15$ MHz. Accordingly, the number N of pairs of electrode fingers can be obtained from the expression of $N=2\times36.15/(40.4-31.9) \approx 8.5$. The pair number N further determines the distance between the end faces of the piezoelectric substrate of the surface wave resonator.

(2) Assigning Weights to the IDT

Figure 5:
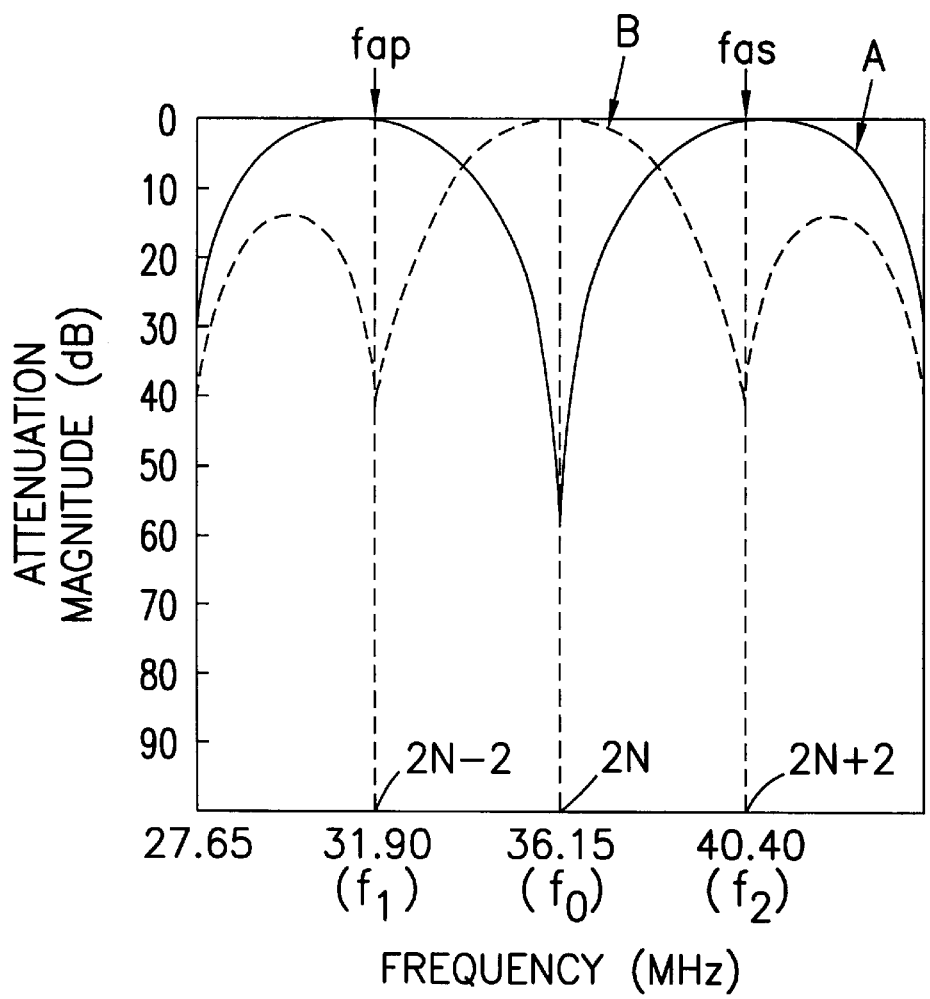
FIG. 5 illustrates frequency spectrums of a weighted IDT and a normal IDT.

FIG. 5 illustrates a characteristic diagram indicating the frequency spectrum B of the normal IDT having the N pairs of electrode fingers obtained by use of the above-described method and also indicating the frequency spectrum A achieved by the below-described weighting method. As indicated by the dotted line B, the frequency corresponding to one attenuation pole of the main lobe of the normal IDT matches the frequency fap (=31.9 MHz), while the frequency associated with the other attenuation pole coincides with the frequency fas (=40.40 MHz). The normal IDT is not excited either in the position of the frequency fap or the fas.

Figure 7:
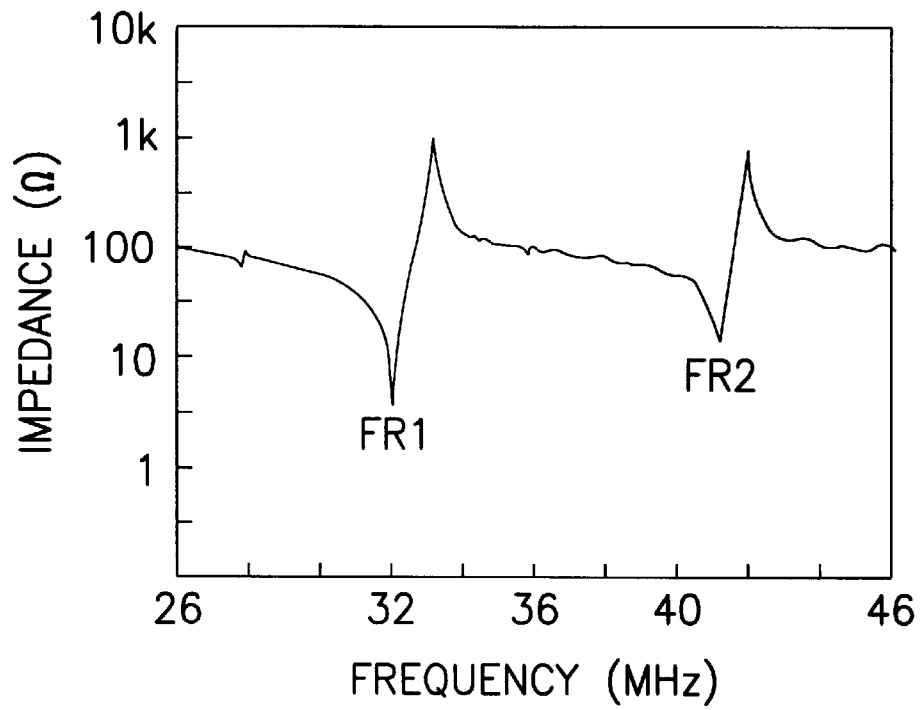
FIG. 7 is a characteristic diagram indicating the impedance against frequency characteristics of the resonator shown in FIG. 6.

Weights are thus assigned to the IDT so as to obtain the frequency spectrum A having two main lobes. In the frequency spectrum A of the weighted IDT, the peaks of the main lobes are respectively positioned at the attenuation poles (the frequencies of the 2N−2 and 2N+2-order modes) of the normal IDT and are excited at the respective frequencies, as shown in FIG. 7, which will be explained later. FIG. 7 also reveals that a great level of attenuation is exhibited at the resonance point of the 2N-order mode, and the frequency corresponding to this mode is not excited. Namely, in this weighted IDT, two types of resonance characteristics can be obtained in which the wave is excited at the frequency positions (fap and fas) associated with the two attenuation poles of the main lobe of the normal IDT.

Figure 6:
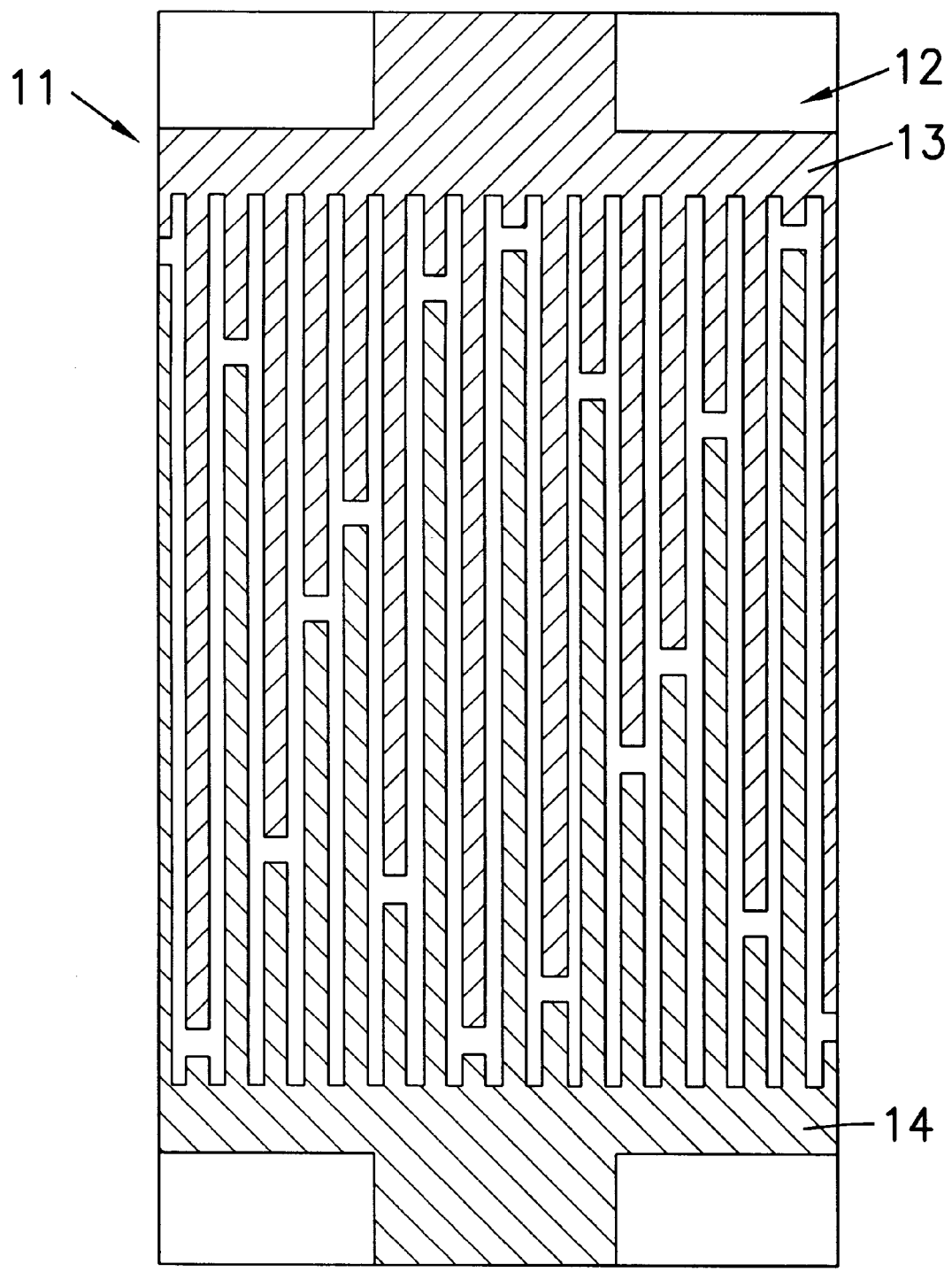
FIG. 6 is a plan view of the configuration of an end-face reflecting-type surface wave resonator according to an embodiment of the present invention.

One example of a technique of assigning weights to the IDT exhibiting the desired frequency spectrum indicated by the solid line A is shown in FIG. 6. An end-face reflecting-type surface wave resonator generally indicated by 11 illustrated in FIG. 6 has a pair of comb-like electrodes 13 and 14 formed on a piezoelectric substrate 12, the electrodes 13 and 14 constituting one IDT. The electrodes 13 and 14 have 8.5 pairs of electrode fingers and are weighted by changing the cross width according to the apodization method. The degree of the weights is selected so that the above-described frequency spectrum indicated by the solid line A is exhibited.

However, the weighting method is not restricted to the technique illustrated in FIG. 6. The frequency spectrum indicated by the solid line A may be achieved by, for example, forming the electrodes 13 and 14 in a shape other than the shape shown in FIG. 6.

Alternatively, the IDT may be weighted according to the finger withdrawal method. Such weighting methods are known and disclosed in, for example, Surface Acoustic Wave Technique, supervised by Kimio Shibayama, The Institute of Electronics, Information and Communication Engineers, pages 66 to 68, incorporated by reference.

The surface wave resonator 11 shown in FIG. 6 is constructed in a manner similar to the resonator 1 illustrated in FIG. 2, except that the IDT is weighted in the above-described manner. An explanation of the construction of the resonator 11 will thus be omitted, while incorporating by reference the description given above in connection with FIG. 2.

FIG. 7 illustrates the impedance versus frequency characteristics of the end-face reflecting-type surface wave resonator 11 using the IDT to which cross-width weights are assigned according to the aforesaid procedure. FIG. 7 shows that two types of resonance characteristics indicated by FR1 and FR2 are obtained in this resonator. FR1 indicates a resonance point corresponding to the peak of one main lobe of the cross-width weighted IDT in the frequency position associated with the (2N−2)-order mode of the normal IDT, while FR2 designates a resonance point corresponding to the peak of the other main lobe of the weighted IDT in the frequency position associated with the (2N+2)-order mode of the normal IDT. Accordingly, two trap devices can be constructed by use of the above-described two resonance points.

Figure 9:
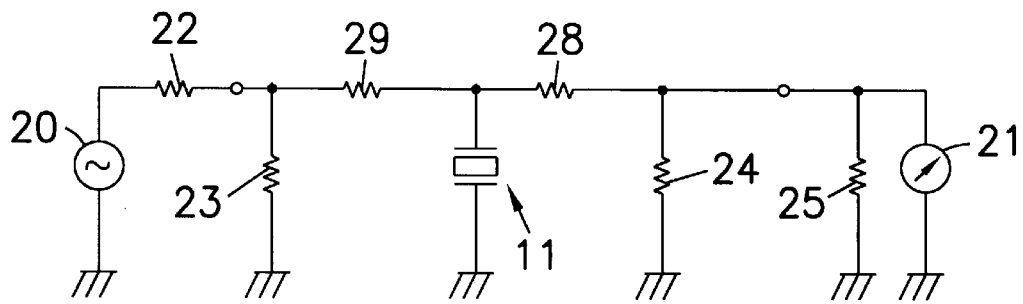
FIG. 9 is a circuit diagram of a measuring circuit for measuring the attenuation characteristics of the trap filter shown in FIG. 8.
Figure 8:
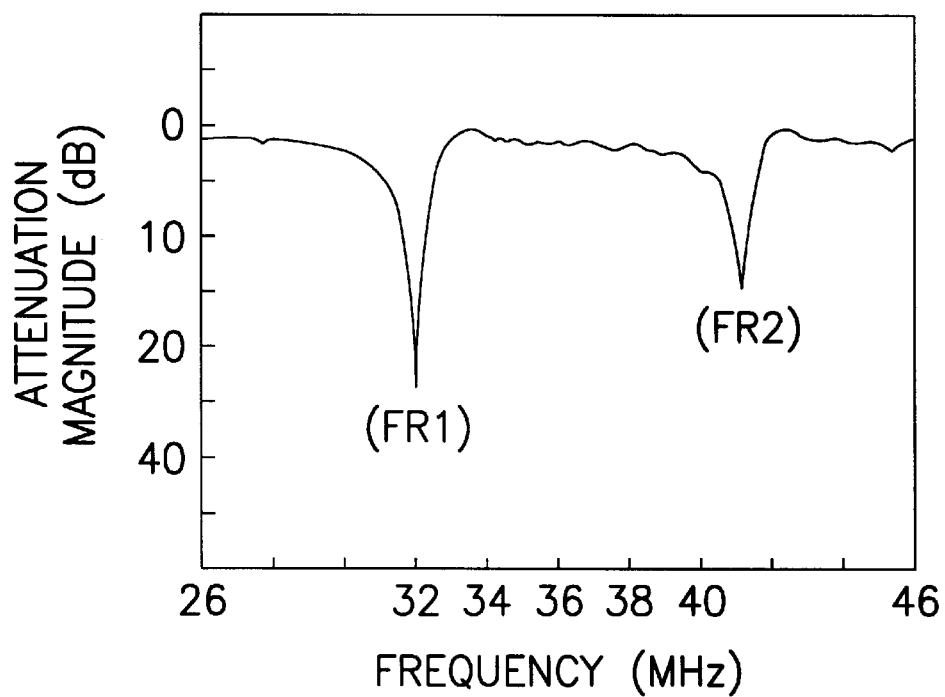
FIG. 8 is a characteristic diagram indicating the attenuation magnitude against frequency characteristics of a trap filter formed by use of the resonator shown in FIG. 6.

FIG. 8 is a characteristic diagram indicating the attenuation magnitude against frequency characteristics obtained by the application of the resonator 11 to a trap circuit. FIG. 9 is a circuit diagram of a measuring circuit used for measuring the characteristics shown in FIG. 8. Referring to FIG. 9, the circuit includes an AC supply 20, a voltmeter 21, resistors 22 and 25 exhibiting a characteristic impedance of the measuring system, and resistors 23 and 24 for adjusting the voltage applied to the surface wave resonator 11 and the output voltage, respectively. Further, resistors 28 and 29 located adjacent to the output and input terminals, respectively, are used to match the impedance.

FIG. 8 shows that a great level of attenuation is achieved at the frequency FR1 corresponding to the adjacent-channel video signal frequency at the video intermediate stage and at the frequency FR2 associated with the adjacent-channel sound signal frequency at the same stage, thereby forming a trap device.

The aforesaid embodiment has been explained in which the peaks of the two main lobes coincide with the positions corresponding to the (2N+2)-order mode and the (2N−2)-order mode, respectively, of the attenuation poles of the main lobe of the normal IDT. However, weights may be assigned to the IDT so that the peaks of the two main lobes can correspond to higher-order even-number modes, for example, 2N+4 and 2N−4, of the normal IDT.

As will be clearly understood from the foregoing description, the present invention offers the following advantages. Weights are assigned to an IDT so as to form peaks of two main lobes, whereby two resonance characteristics can be obtained merely by a single device. It is thus possible to provide a surface wave resonator best suited for uses requiring two resonance characteristics, for example, a trap circuit at the video intermediate frequency stage. Further, since two resonance characteristics can be achieved by a single device, it is possible to simplify the configuration of a circuit, such as a trap circuit or the like, to eliminate the complicated and troublesome connecting operation, and also to effectively reduce the space required for the circuit.

Although the present invention has been described in relation to particular embodiments thereof, many other variations and modifications and other uses will become apparent to those skilled in the art. The present invention is not limited by the specific disclosure herein.

What is claimed is:

1. An end-face reflecting-type surface wave resonator comprising:

a piezoelectric substrate having two oppositely-facing end faces for reflecting an SH-type surface wave;

an interdigital transducer disposed on said piezoelectric substrate and having N pairs of electrode fingers each having a respective dimension corresponding to an assigned weight, frequency characteristics of said weighted interdigital transducer having two main lobes and an attenuation pole between said two main lobes, wherein said weights are assigned to said electrode fingers in such a manner that the peaks of said two main lobes substantially and respectively coincide with frequency positions of two even modes of a frequency spectrum determined by the number N of said pairs of electrode fingers and a distance between two oppositely-facing end faces of said piezoelectric substrate, and such that the attenuation pole substantially coincides with frequency positions of 2Nth modes of the frequency spectrum, whereby said end-face reflecting-type surface wave resonator has two resonance characteristics.

2. A surface wave resonator according to claim 1, in a video intermediate frequency stage of a video circuit, said video IF stage having an input and an output, said resonator being connected for receiving signals from said input and for providing signals to said output, wherein the first type of resonance characteristic corresponds to an adjacent-channel video signal frequency of said video IF stage, while the second type of resonance characteristic exhibiting a higher frequency than said first type of resonance characteristic corresponds to an adjacent-channel sound signal frequency of said video IF stage, whereby said resonator functions as a trap circuit for said IF stage.

3. A surface wave resonator according to claim 1, wherein each said weight is assigned according to a cross-width weighting method.

4. A surface wave resonator according to claim 1, wherein each said weight is assigned according to an electrode-finger withdrawal method.

* * * * *